(12) United States Patent
Marano et al.

(10) Patent No.: US 12,386,378 B2
(45) Date of Patent: Aug. 12, 2025

(54) PIECEWISE LINEAR FUNCTION GENERATING ELECTRONIC CIRCUIT, CORRESPONDING GENERATOR, AMPLIFIER, METHOD AND COMPUTER PROGRAM PRODUCT

(71) Applicant: STMicroelectronics S.r.l., Agrate Brianza (IT)

(72) Inventors: Barbaro Marano, Viagrande (IT); Mario Chiricosta, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 687 days.

(21) Appl. No.: 17/702,362

(22) Filed: Mar. 23, 2022

(65) Prior Publication Data

US 2022/0308615 A1    Sep. 29, 2022

(30) Foreign Application Priority Data

Mar. 25, 2021  (IT) .................. 102021000007340

(51) Int. Cl.
*H03F 3/04* (2006.01)
*G05F 3/26* (2006.01)
(Continued)

(52) U.S. Cl.
CPC ......... *G05F 3/262* (2013.01); *H03F 3/45183* (2013.01); *H03F 3/343* (2013.01); *H03F 3/345* (2013.01); *H03F 3/45071* (2013.01)

(58) Field of Classification Search
CPC ...... G05F 3/262; G05F 3/265; H03F 3/45183; H03F 3/45179; H03F 1/523;
(Continued)

(56) References Cited

U.S. PATENT DOCUMENTS 5,311,085 A * 5/1994 Pelgrom ................ H03K 5/249
                                                     330/253
5,966,319 A * 10/1999 Sato ........................ G11C 11/41
                                                     365/177
(Continued)

OTHER PUBLICATIONS

Bean J T et al: "A current mode analog circuit for tent maps using piecewise linear functions", Circuits and Systems, 1994. ISCAS '94., 1994 IEEE International Symposium on London, Uk May 30-Jun. 2, 1994, New York, NY, USA,IEEE, US, vol. 6, May 30, 1994 (May 30, 1994), pp. 125-128, XP010143511, DOI: 10.1109/ISCAS.1994.409542.

(Continued)

*Primary Examiner* — Khanh V Nguyen
(74) *Attorney, Agent, or Firm* — Crowe & Dunlevy LLC

(57) ABSTRACT

A cell includes a first pair and a second pair of MOS transistors. Each of the first pair and second pair of MOS transistors have drain electrodes coupled to a respective common input node. Each of the first pair and second pair of MOS transistors includes a diode-connected MOS transistor and a latched MOS transistor. The latched MOS transistors of the first pair and second pair of MOS transistors have cross-coupled gate and drain electrodes. Source electrodes of the diode connected MOS transistors from the first pair and second pair of MOS transistors are coupled to a first current output common node to output a current to a first current collecting circuit. Source electrodes of the latched MOS transistors of the first pair and second pair of MOS transistors are coupled to a second current output common node to output a current to a second current collecting circuit.

25 Claims, 15 Drawing Sheets

(51) Int. Cl.
  *H03F 3/45* (2006.01)
  *H03F 3/343* (2006.01)
  *H03F 3/345* (2006.01)

(58) Field of Classification Search
  CPC ....... H03F 2200/91; H03F 2203/45318; H03F 3/45071; H03F 3/45085; H03F 3/343; H03F 3/345; H03K 4/48; G06F 7/523
  USPC .................................................. 330/257, 288
  See application file for complete search history.

(56) References Cited

U.S. PATENT DOCUMENTS

| | | | | |
|---|---|---|---|---|
| 7,405,987 | B1 * | 7/2008 | Moscaluk | H03F 3/45183 |
| | | | | 365/207 |
| 8,085,067 | B1 * | 12/2011 | Stiff | H03F 3/45179 |
| | | | | 330/252 |
| 8,692,582 | B1 * | 4/2014 | Atesoglu | H03K 5/249 |
| | | | | 327/97 |
| 2019/0372529 | A1 | 12/2019 | Moretti et al. | |

OTHER PUBLICATIONS

Camponogara Eduardo et al: "Models and Algorithms for Optimal Piecewise—Linear Function Approximation", Mathematical Problems in Engineering, vol. 2015, Jan. 1, 2015 (Jan. 1, 2015), pp. 1-9, XP055875365, CH.
IT Search Report and Written Opinion for priority application, IT Appl. No. 102021000007340, report dated Jan. 14, 2022, 9 pgs.

\* cited by examiner

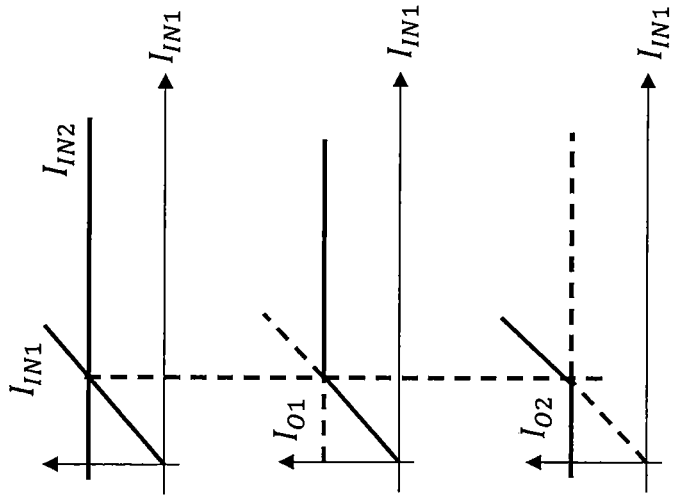
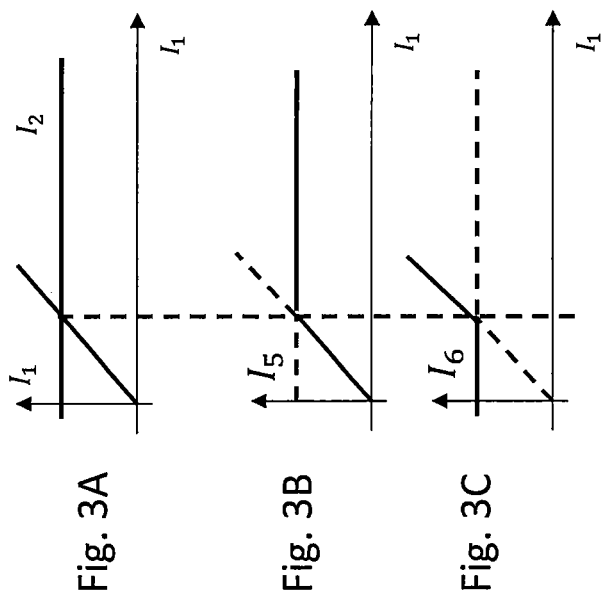
Fig. 5A
Fig. 5B
Fig. 5C
Fig. 3A
Fig. 3B
Fig. 3C

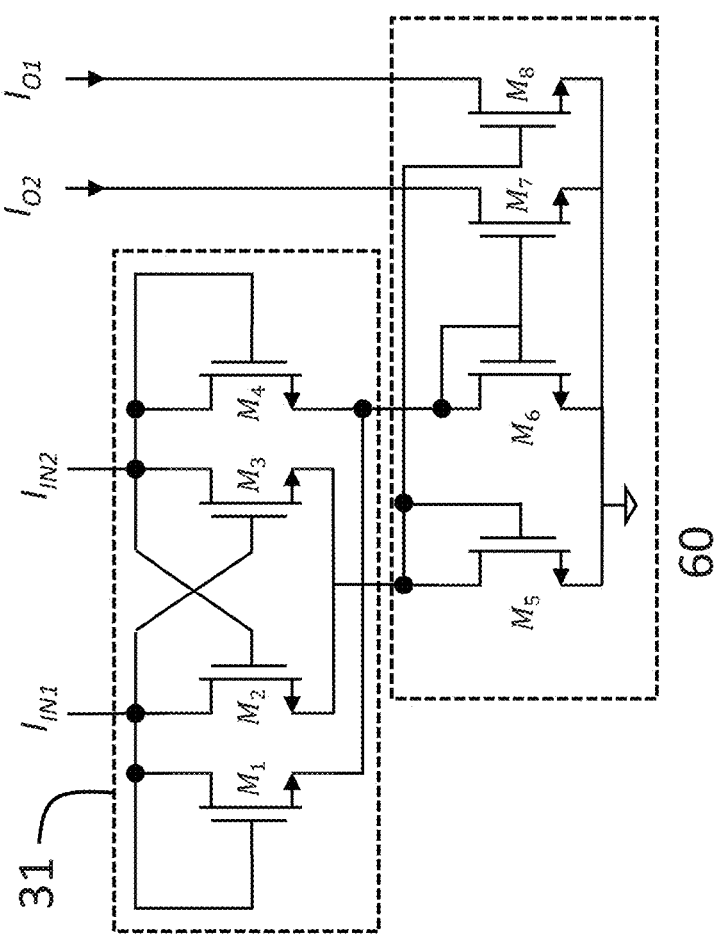
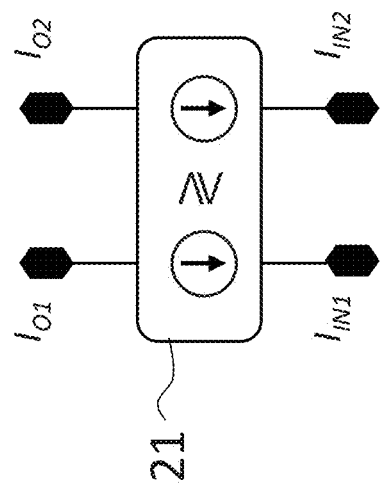
Fig. 4
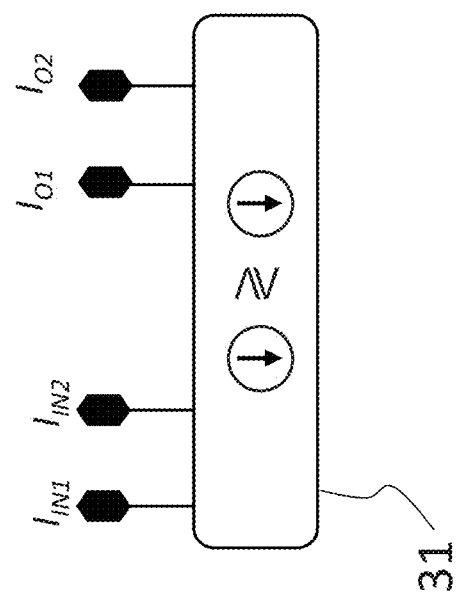
Fig. 6A
Fig. 6B

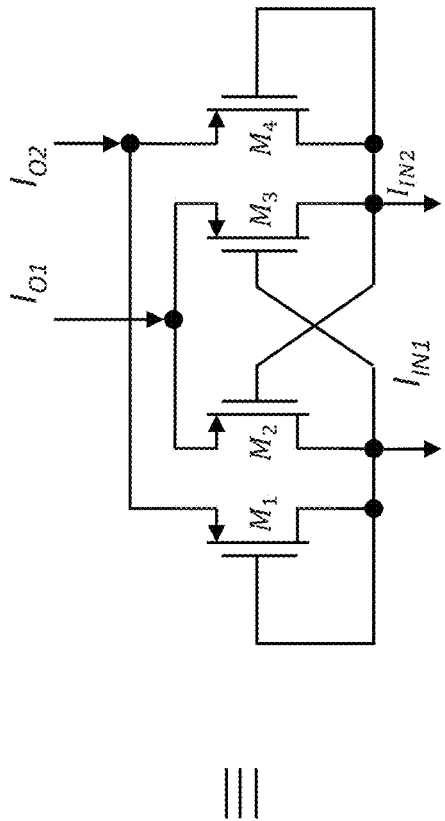
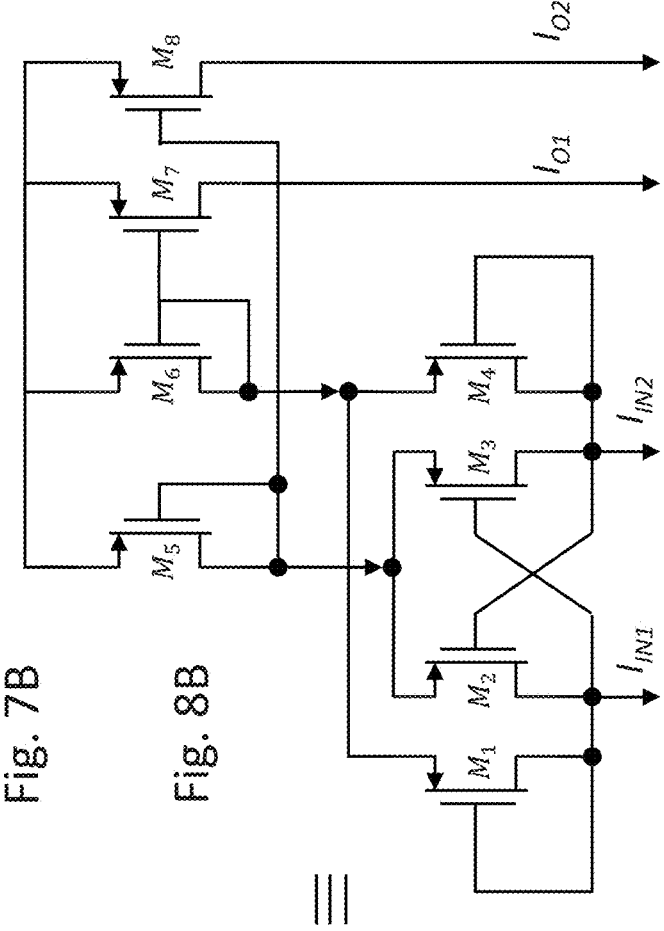
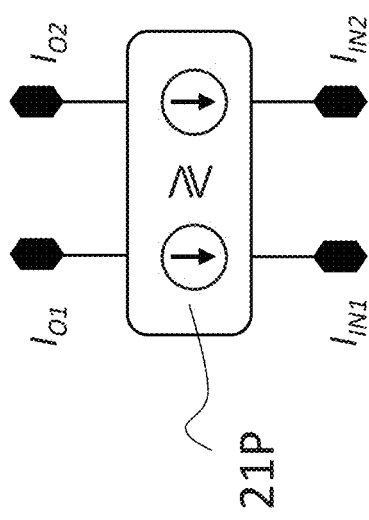
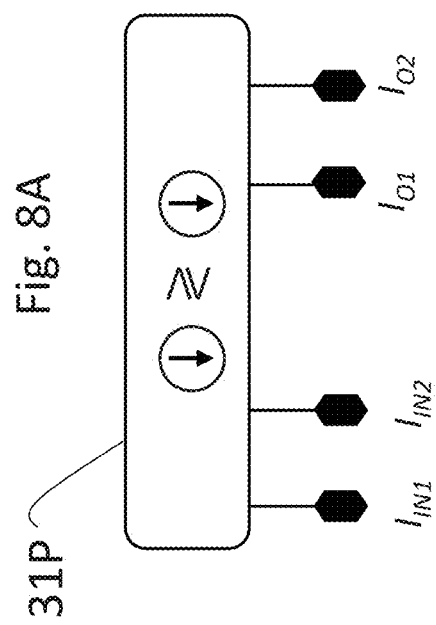
Fig. 7A
Fig. 7B
Fig. 8A
Fig. 8B

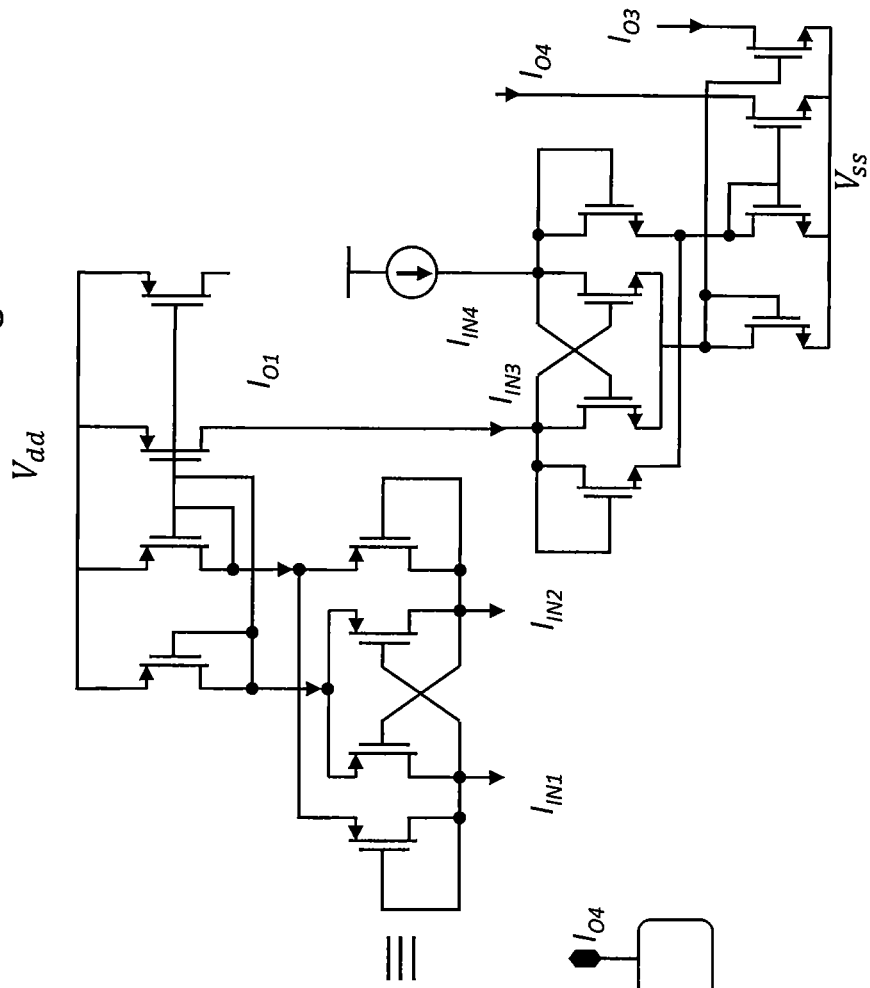
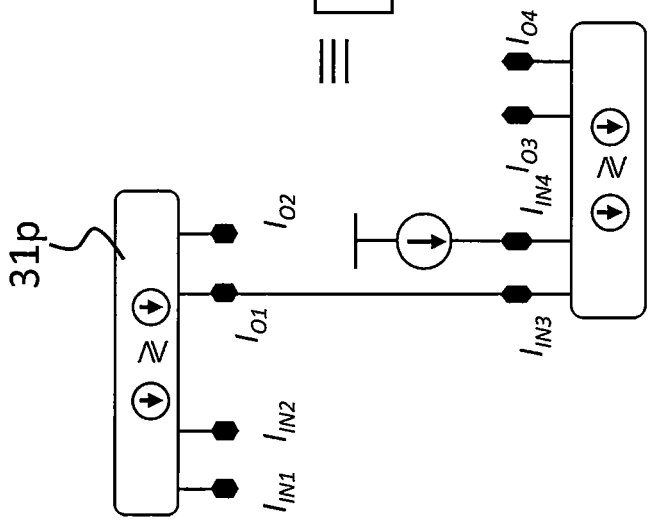
Fig. 11A
Fig. 11B

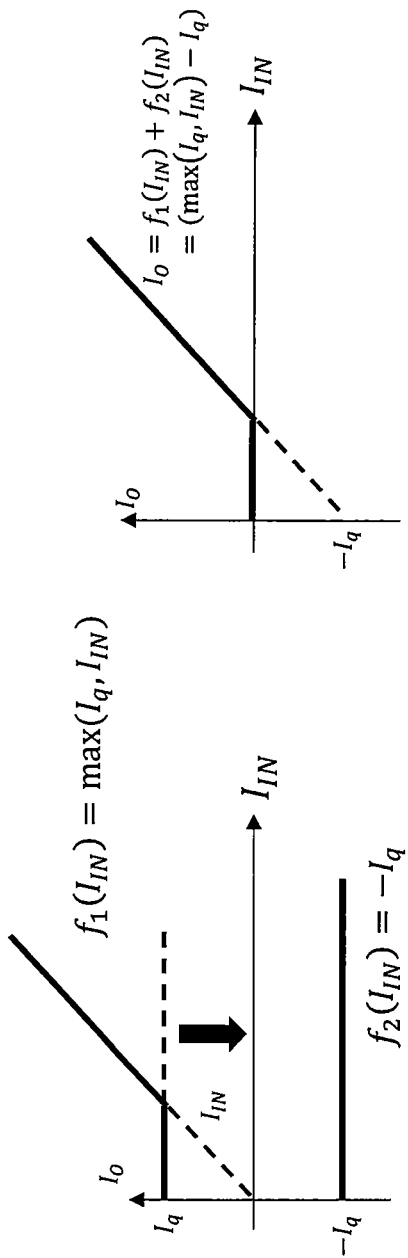
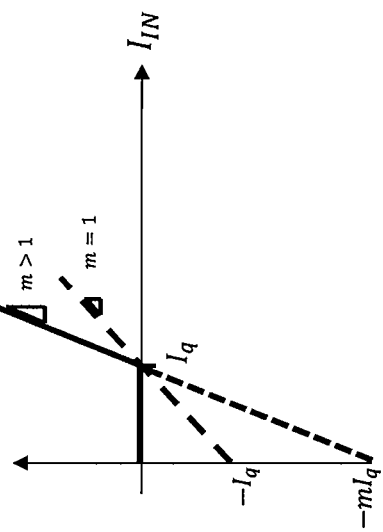
Fig. 14A
Fig. 14B
Fig. 14C

PIECEWISE LINEAR FUNCTION GENERATING ELECTRONIC CIRCUIT, CORRESPONDING GENERATOR, AMPLIFIER, METHOD AND COMPUTER PROGRAM PRODUCT

PRIORITY CLAIM

This application claims the priority benefit of Italian Application for Patent No. 102021000007340, filed on Mar. 25, 2021, the content of which is hereby incorporated by reference in its entirety to the maximum extent allowable by law.

TECHNICAL FIELD

Embodiments of the present disclosure relate to solutions for the generation of piecewise linear current transfer functions.

Embodiments of the present disclosure relate in particular to modules performing a current limiter function and/or a current maximizing function.

BACKGROUND

Some applications require a current Piece-Wise Linear (PWL) transfer function. A possible case of that is a current limiter.

FIG. 1 shows an example of known current limiter 10 comprising a NMOS transistor $M_{l1}$, with a respective threshold voltage VTH1, which receives an input voltage on its gate, through a series resistor R1 and has its drain coupled to the voltage supply VDD and its source coupled through a sense resistor R2 to ground. A second NMOS transistor $M_{l2}$, with a respective threshold voltage VTH2, has its gate coupled to the source of the NMOS transistor $M_{l1}$, its drain coupled to the gate of $M_{l1}$ and its emitter coupled to ground GND. A current $I_L$ flows through the NMOS transistor $M_{l1}$. As long as the voltage across the sense resistor R2 is less than $V_{GS2}$, the gate source voltage of transistor $M_{l2}$, only the NMOS transistor $M_{l1}$ conducts. In this case the output current is fixed by the resistor R2, $I_L$=VDD/R2 Whenever the load current $I_L$ reaches a value such that the voltage across the sense resistor R2 exceeds the threshold voltage of the transistor $M_{l2}$, VTH2, the NMOS transistor $M_{l2}$ starts conducting. In this case, the output current is fixed by VGS2/R2.

In such a circuit the precision of the current limiting function depends on several uncertain variables, VTH1, VTH2, R1, R2 with accuracies of ±20%, which is not enough for many applications.

There is accordingly a need in the art for solutions which overcome one or more of the previously outlined drawbacks.

SUMMARY

According to one or more embodiments, an electronic circuit is presented for generating a piecewise linear current transfer function. Embodiments moreover concerns a corresponding related method as well as a related computer program product and a related class AB amplifier, loadable in the memory of at least one computer and including software code portions for performing the steps of the method when the product is run on a computer.

As used herein, reference to such a computer program product is intended to be equivalent to reference to a computer-readable medium containing instructions for controlling a computer system to coordinate the performance of the method. Reference to "at least one computer" is evidently intended to highlight the possibility for the present disclosure to be implemented in a distributed/modular fashion.

In an embodiment, an electronic circuit for generating a piecewise linear current transfer function comprises: at least a latched circuit module or cell comprising a first pair of MOS transistors and a second pair of MOS transistors, each of the first pair of MOS transistors and second pair of MOS transistors having their drain electrodes coupled to a respective common input node; each of the first pair of MOS transistors and second pair of MOS transistors comprising a diode-connected MOS transistor and a latched MOS transistor, the latched MOS transistors of the two pairs having their respective gate electrodes coupled to the drain of the other latched MOS transistor; the source electrodes of the diode connected MOS transistors of the first pair and second pair of MOS transistors are coupled to a respective current first output common node and the source electrodes of the latched MOS transistors of the first pair and second pair of MOS transistors are coupled to a respective second output common node.

In variant embodiments, the latched cell is coupled to a first collecting circuit coupled to collect a current at the first output common node, in particular to implement an input current maximizing function between currents applied at the input nodes of said latched cell, and/or a second collecting circuit coupled to collect a current as the second output node, in particular to implement a current minimizing function between currents applied at the input nodes of said latched cell.

In variant embodiments, the latched cell is coupled to one or more current supplying circuits configured to supply a first current to the common input node of one between the first pair and the second pair and/or a second current to the common input node of the other pair.

In variant embodiments, the electronic circuit wherein the first input current is variable, in particular a current ramp, and the second current is a constant reference current.

In variant embodiments, the MOS transistors are NMOS.

In variant embodiments, the MOS transistors are PMOS.

In variant embodiments, the latched cell is configured to have the input currents and the output currents flowing in opposite direction with respect to their input and output nodes.

In variant embodiments, the latched cell is configured to have the input currents and the output currents both entering or exiting their input and output nodes.

In variant embodiments, the dimensions of the MOS transistors are the same.

In variant embodiments, said cell receives as inputs a current ramp and a constant value current corresponding to a negative offset value and includes a first collecting circuit coupled to collect a current at the first output common node to implement an input current maximizing function between currents applied at the input nodes of said latched cell, a subtraction block in which the current constant value is subtracted from the output of said latched cell configured to perform a maximizing function, said circuit further comprising a multiplier block configured to multiply by an integer the output of said multiplier, in order to implement a current ramp with the negative offset generator.

The solution here described refers also to a piecewise linear generator comprising one or more of the circuits according to the above.

The solution here described refers also to a class AB amplifier having a differential architecture, comprising respective positive and negative input stages coupled to a level shifter, wherein said positive and negative input stages are coupled to a respective circuit.

The solution here described refers also to a method for generating a piecewise linear transfer function, comprising using one or more of the circuits for generating a piecewise linear current transfer function of any of the previous embodiments.

In variant embodiments, a method comprises: defining a linear piecewise current characteristic as a sequence of functions nested one into the other; configuring a first circuit for generating a piecewise linear current transfer function implementing the innermost nested function; and configuring cascaded subsequent circuits for generating a piecewise linear current transfer function to perform the subsequent nested functions.

The solution here described refers also to a computer-program product that can be loaded into the memory of at least one processor and comprises portions of software code for implementing the method according to the previous method.

BRIEF DESCRIPTION OF THE DRAWINGS

Embodiments of the present disclosure will now be described with reference to the annexed drawings, which are provided purely by way of non-limiting example and in which:

FIGS. 3A-3C show characteristic diagrams of the currents of the circuit of FIG. 2A, 2B;

FIG. 4 show an embodiment of the circuit here described;

FIGS. 5A-5C show characteristic diagrams of the currents of circuits of previous embodiments;

FIGS. 6A-6B show an embodiment of the circuit here described;

FIGS. 7A-7B show an embodiment of the circuit here described;

FIGS. 8A-8B show an embodiment of the circuit here described;

FIGS. 11A-11B show an embodiment of the circuit here described;

FIGS. 14A-14C show characteristic diagrams of the currents of the circuit of FIG. 13A, 13B;

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figures parts, elements or components which have already been described with reference to FIGS. 1 to 4 are denoted by the same references previously used in such figures; the description of such previously described elements will not be repeated in the following in order not to overburden the present detailed description.

Figure 1:
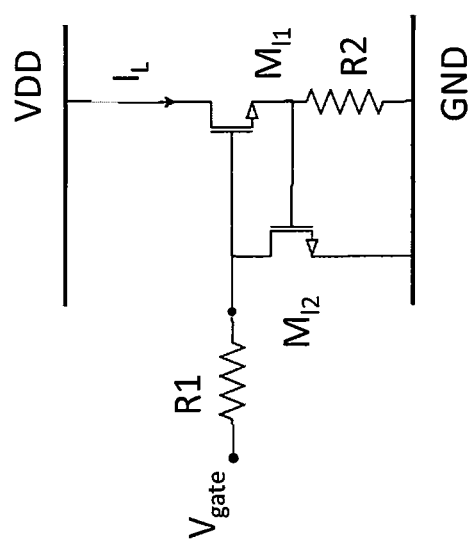
FIG. 1 has already been described in the foregoing.
Figure 2A:
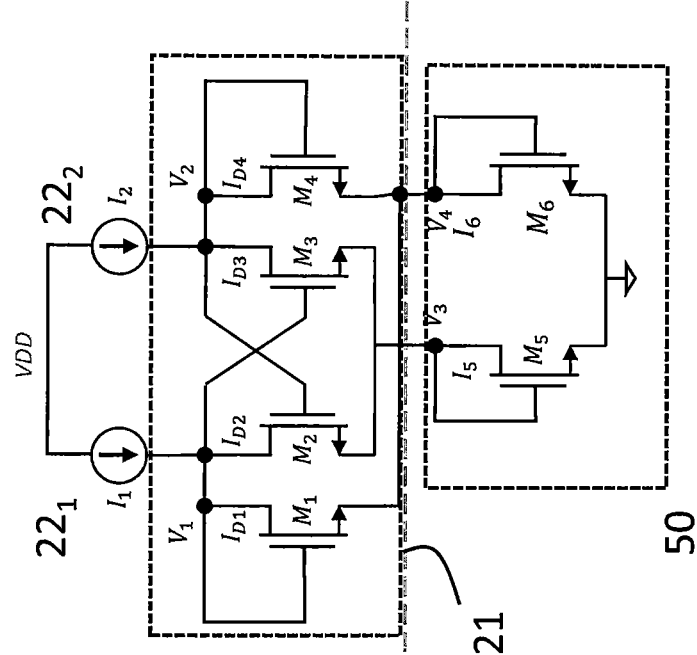
FIGS. 2A-2B show an embodiment of the circuit here described.

FIG. 2A shows a circuit schematic of an embodiment of an electronic circuit 20 for generating a piecewise linear current transfer function, which includes a latched cell 21. Such latched cell 21 comprises a first pair of NMOS transistors $M_1$, $M_2$, having their drain electrodes coupled together at a respective input common node, which is indicated with $V_1$, this reference designating for simplicity of representation also the voltage forming on such node. The embodiment of FIG. 2A represents the circuit 20 without a current collecting circuit coupled to its output. Then the latched cell 21 includes a second pair of NMOS transistors $M_3$, $M_4$, which is similarly coupled, the drain electrodes coupled together in a second input common node, which is indicated with $V_2$. NMOS transistors $M_1$ and $M_4$ are diode-connected (i.e., their drain is coupled to their gate). NMOS transistors $M_2$ and $M_3$ have their respective gates coupled to the drain of the other NMOS, which are also the input nodes $V_1$ and $V_2$. The source electrodes of transistors $M_1$, $M_2$, $M_3$, $M_4$ in FIG. 2A are coupled together, and then to ground GND. However, this is only because for simplicity in FIG. 2A the cell 21 is not shown coupled to current collecting circuits, while the actual configuration of the source nodes is shown with reference to FIG. 2B, where a collecting circuit 50 is coupled to the latched cell 21 outputs.

Two respective current generators $22_1$ and $22_2$ are coupled between the voltage supply VDD and the input common nodes $V_1$ and $V_2$, respectively, for injecting a respective first input current $I_1$ and second input current $I_2$ entering the drain electrodes of the two pairs $M_1$, $M_2$ and $M_3$, $M_4$. Current generators $22_1$ and $22_2$ are representative of current supplying circuits, which can supply for instance constant currents or current ramps. Such current supplying circuits may be embodied also by other electronic circuits for generating a piecewise linear current transfer function supplying current at their outputs, which are coupled to the circuit 20 of FIG. 2A to supply the input current $I_1$ and second input current $I_2$.

Thus, NMOS transistors $M_1$ and $M_4$ can be defined as the diode-connected transistors of the pairs, while NMOS $M_2$ and $M_3$ are indicated as the latch transistors of the two pairs.

Considering thus the electronic circuit 20 of FIG. 2A when currents $I_1=I_2$, if the dimensions of the NMOS transistors $M_1$, $M_2$, $M_3$, $M_4$, are the same (i.e., such NMOS are identical, e.g., have matching MOS parameters), the first input current $I_1$ is equally divided between the NMOS transistors $M_1$ and $M_2$ of the first pair and for the drain currents $I_D$, $I_{D1}=I_{D2}=I_1/2$ and $I_{D3}=I_{D4}=I_2/2$.

Indicating as mentioned with $V_1$ the voltage on the drain electrodes of the first pair, i.e., the voltage on the input node of such pair, and with $V_2$ the voltage on the drain electrodes of the second pair, i.e., the voltage on the input node of the second pairs, in this equilibrium point, i.e., when currents $I_1=I_2$, $V_1=V_2$ so that the NMOS transistor $M_1$, $M_2$, $M_3$, $M_4$ are each in saturation zone.

Figure 2B:
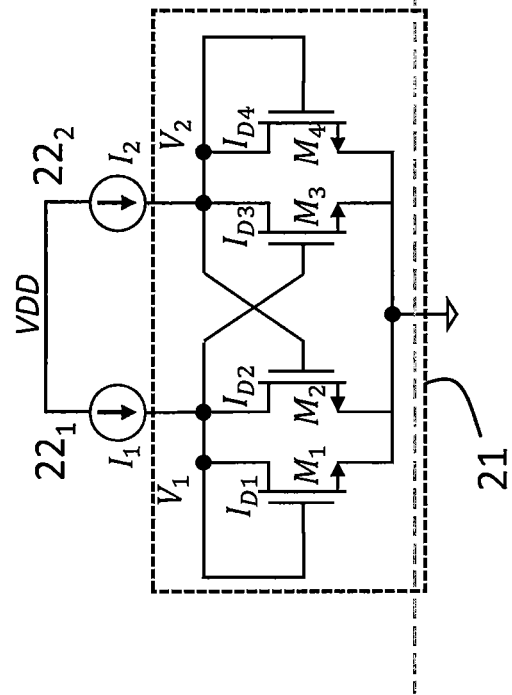

It is underlined that the circuit in FIG. 2A is a schematic representation of the circuit here described, to help understand the working principle, while an embodiment of the circuit is shown in FIG. 2B. The circuit of FIG. 2A operates as a current comparator comparing the first input current $I_1$ and the second input current $I_2$, however to read the result of the comparison is necessary that the output currents $I_{D1}$, $I_{D2}$, $I_{D3}$, $I_{D4}$ are not merged together in a ground node, as shown in FIG. 2A. In the embodiment of FIG. 2B described here below these currents are grouped accordingly (i.e. $I_{D6}=I_{D1}+I_{D4}$ and $I_{D5}=I_{D2}+I_{D3}$).

In FIG. 2B it is therefore shown a circuit equivalent to that to FIG. 2A, in which to the electronic circuit 20 is coupled a circuit 50 which is just an example of a utilizer circuit, or current collecting circuit, collecting the currents coming from the first transistor pair and the second transistor pair, i.e., from the sources of the NMOS $M_1$, $M_2$ of the first pair and from the sources of the NMOS $M_3$, $M_4$ respectively, which in FIG. 2A are shown as coupled to ground. The current collecting circuit 50 simply includes a first diode connected collect NMOS transistor $M_5$ coupled by its drain to the sources of the NMOS transistors $M_2$, $M_3$, through which flows a first collected current $I_5$ from its drain to the ground where the source of the first diode connected collect NMOS transistor $M_5$ is coupled. A second diode connected collect NMOS transistor $M_6$ is analogously coupled to the sources of the NMOS transistors $M_1$, $M_4$. Indicating with $V_3$ and $V_4$ the voltage on the drains of transistors $M_5$ and $M_6$, as mentioned the circuit of FIG. 2B is equivalent to the circuit of FIG. 2A at the equilibrium, since $V_3=V_4$ and transistors $M_5$ and $M_6$ are just collecting the currents coming from $M_{1-4}$ and $M_{2-3}$.

Although the circuit of FIG. 2B shows the circuit 20 including the latched cell 21 when in use, and in particular shows the outputs of the latched cell 21, i.e. the source electrodes of the diode connected MOS transistors $M_1$, $M_4$ of the first pair and second pair are coupled to a respective current maximizing output common node $V_4$ and the source electrodes of the latched MOS transistors $M_2$, $M_3$ of the first pair and second pair being coupled to a respective current minimizing output common node $V_3$, given the equivalence the circuit of FIG. 2A is considered for simplicity.

Considering thus a small signal current $I_{I_d}$ applied on input nodes $V_1$ and $V_2$, the input impedance $Z_{IN}$ of the circuit 20, i.e., cross-coupled latch, is:

$$Z_{IN} \to \infty$$

Thus, applying a current small signal $i_{I_d}$ the circuit reacts with an ideal output $v_{O_d}$:

$$v_{O_d}=v_2-v_1=Z_{IN} \cdot i_{I_d} \infty$$

This means that if it is applied a small current difference between the latch input nodes $V_1$ and $V_2$, the latch saturates the outputs conveying the first current $I_1$ only on NMOS $M_1$ or $M_2$ of the first pair, and similarly happens for the second current $I_2$.

The previously discussed equilibrium point is thus an unstable equilibrium point.

It is possible to generalize the case saying that if $I_1>I_2$ then:

$$I_1 \to M_1 \text{ and } I_2 \to M_3$$

While if $I_1<I_2$ then:

$$I_1 \to M_2 \text{ and } I_2 \to M_4$$

In other words, the larger current will flow always through the diode connected devices $M_1$, $M_4$.

Therefore, if it is collected the current flowing through the diode connected devices $M_1$, $M_4$ and the current flowing in the latch stage $M_2$, $M_3$, this corresponds to performing a mathematical operation $$I_6=\max(I_1,I_2)$$

$$I_5=\min(I_1,I_2)$$

where $I_5$ and $I_6$ are the first and second output current from output nodes $V_3$ and $V_4$ which can flow for instance through circuit 50 of FIG. 2B. For this reason, node $V_4$ in which flows current $I_6$ is a current maximizing output common node, while node $V_3$ in which flows current $I_5$ is a current minimizing output common node $V_3$, also used as current limiter.

Under this view, the collecting circuit 50 includes a first collecting circuit, transistor $M_6$, coupled to collect a current $I_6$ at the first output common node $V_4$, in particular to implement an input current maximizing function between currents applied at the input nodes, and/or a second collecting circuit, transistor $M_5$ coupled to collect a current $I_5$ as the second output node $V_3$, in particular to implement a current minimizing function between currents applied at the input nodes. Current collecting circuit 50 includes both the first and the second collecting circuit, however it is clear that only the first collecting circuit, transistor $M_6$, or the second collecting circuit, transistor $M_5$, may be present, if the circuit 20 is configured to implement a current maximizing function or current minimizing function only, i.e.

$$I_6=\max(I_1,I_2)$$

$$I_5=\min(I_1,I_2)$$

Also, such first and second collecting circuits can correspond to the inputs of other circuits like the electronic circuit 20 for generating a piecewise linear current transfer function.

In the same way, the electronic circuit 20 for generating a piecewise linear current transfer function may be coupled to one or more current supplying circuits configured to supply a first current, $I_1$ to the common input node of one between the first pair $M_1$, $M_2$ and the second pair $M_3$, $M_4$ and/or a second current $I_2$ to the common input node of the other pair. Such current supplying circuits as mentioned may be embodied by current generators, or other circuits like the electronic circuit for generating a piecewise linear current transfer function 20.

As shown in the diagrams of FIG. 3A-3C, showing the input currents $I_1$, $I_2$ as a function of first input current $I_1$. Here and in the following figures, all the diagrams showing the currents are plotted as having the first input current on the abscissa. The first input current $I_1$ is a current ramp, and the second current $I_2$ is constant (FIG. 3A).

Diagrams 3A-3C refer to a static condition. The slope of the first input current $I_1$ here is unity since the first input current $I_1$ (FIG. 3A) is the quantity both in x-axis and y-axis.

Instead, in FIGS. 10A-10C and 12A-12C, described in the following, the slope can be different from the value one, since they contain input different from the first input current $I_1$, e.g., $I_4$. In embodiments, the circuit 20 may use a first input current $I_1$ which is variable, for instance a current ramp, while the second input current $I_2$ may be a constant reference current. The first output current $I_5$ (FIG. 3B) is limited to the minimum value of input currents $I_1$ and $I_2$, i.e., follows first input current $I_1$ and then when $I_1$ exceeds $I_2$ stays at the constant reference value of $I_2$. Thus, on the first output current $I_5$, the circuit 20 operates as a current limiter, i.e. performs a function which is $\min(I_1,I_2)$. Of course, the latched cell 21 may receive at is inputs any type of current, i.e., with any type of variation in time, performing its current maximizing or minimizing operation depending on the output which is selected.

On the other hand, the second output current $I_6$ (FIG. 3C) follows the maximum value of the input currents $I_1$ and $I_2$, i.e., follows $I_2$ and then when $I_1$ exceeds $I_2$ follows the increase of the first current $I_1$. Thus, on the second output current $I_6$, the circuit 20 operates as a current maximizer, i.e. performs a function which is $\max(I_1,I_2)$.

In FIG. 4 the latch cell 21 is schematized with the first input current and second input current indicated here as $I_{IN1}$, $I_{IN2}$, corresponding to $I_1$ and $I_2$ applied by the current generators in FIG. 2A, 2B, and the output currents $I_{O1}$, $I_{O2}$ corresponding to the current $I_5$, $I_6$ respectively, outputted from the two NMOS transistor pairs of the latch 21. The behavior of currents $I_{IN1}$, $I_{IN2}$, $I_{O1}$, $I_{O2}$ is shown in FIGS. 5A-5C and corresponds to that of FIGS. 3A-3C.

The latch cell 21 described before can be seen as an elementary logical block, having as input currents first input current $I_{IN1}$ and second input current $I_{IN2}$ and as output currents $I_{O1}$, $I_{O2}$ which supply the minimum or maximum of the input currents. If one of the input currents is a constant current, e.g. $I_{IN2}$, the output current $I_{O1}$ taken on the sources of the latched transistors implements a current limiter.

In a variant embodiment 31, shown in FIG. 6A, the latched cell or elementary logical block can have the outputs on the same side of the inputs, i.e. an elementary logic block in which both the input currents and the output currents are entering (or dually exiting) their respective input or output nodes, i.e. they have the same direction with respect to their respective input or output nodes, as opposed to the latched cell 21, where the input currents and the output current have opposite direction, i.e. input currents enter the block, output currents exit the block.

This is convenient to cascade a chain of elementary cells.

As detailed in FIG. 6B, showing the corresponding circuit, the sources of the diode connected NMOS, $M_1$, $M_4$ are coupled in a same node, coupled to $M_6$, while the sources of the latch NMOS, $M_1$, $M_4$ are coupled in a same node, coupled to $M_5$, on these two nodes being collected the output currents $I_{O1}$ and $I_{O2}$ respectively. In the case of FIG. 6B, $M_5$ is coupled to a NMOS $M_8$ to form a current mirror outputting the first output current $I_{O1}$, while $M_5$ is coupled to a respective NMOS $M_7$ to form a current mirror outputting the second output current $I_{O2}$. The cell 31 of FIGS. 6A-6B behaves as described in the diagrams of FIGS. 3A-3C.

FIGS. 7A-7B and 8A-8B show the same blocks 21 and 31 implemented with PMOS transistors, instead of NMOS transistors. The structure of the latch is the same, i.e., the latch PMOS are coupled one to the other drain to gate, and the input currents $I_{IN1}$, $I_{IN2}$ are exiting their drains to ground or to a current generator coupled to ground, while at sources of the pairs are the output currents $I_{O1}$, $I_{O2}$, which flows from the PMOS digital voltage supply VSS.

Figures 9A, 9B:
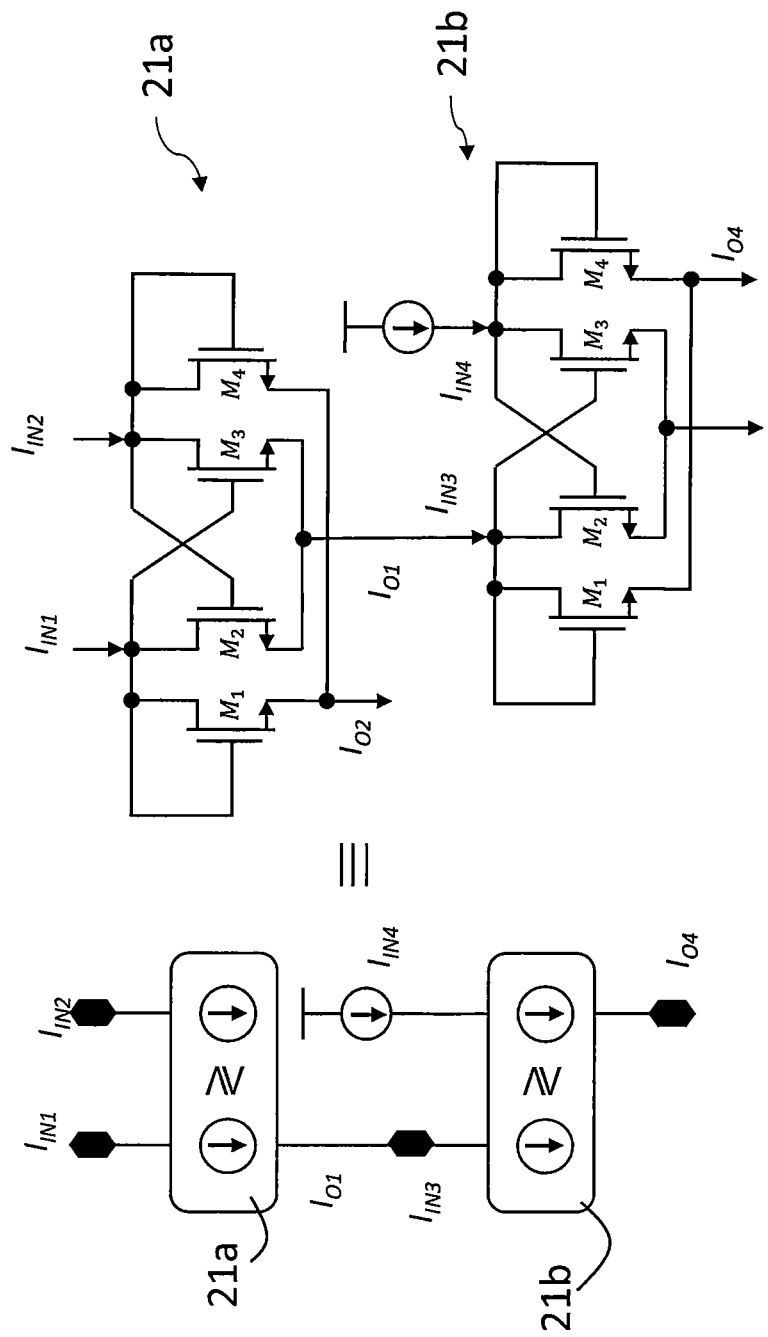
FIGS. 9A-9B show an embodiment of the circuit here described.

FIG. 9A shows an embodiment in which two latched cells, or elementary blocks, 21a, 21b are cascaded to implement a nested function.

In this case the output of a first latch 21a, with NMOS transistors, receives input currents $I_{IN1}$, $I_{IN2}$. The first output current $I_{O1}$ is supplied as first input current $I_{IN3}$ of a second latch 21b, while the second input current of the second latch 21b is a current $I_{IN4}$, collecting the output current $I_{O4}$, which results:

$$I_{O4}=\max(I_{IN3},I_{IN4})=\max(\min(I_{IN1},I_{IN2}),I_{IN4}).$$

Figures 10A, 10B, 10C, 12A, 12B, 12C:
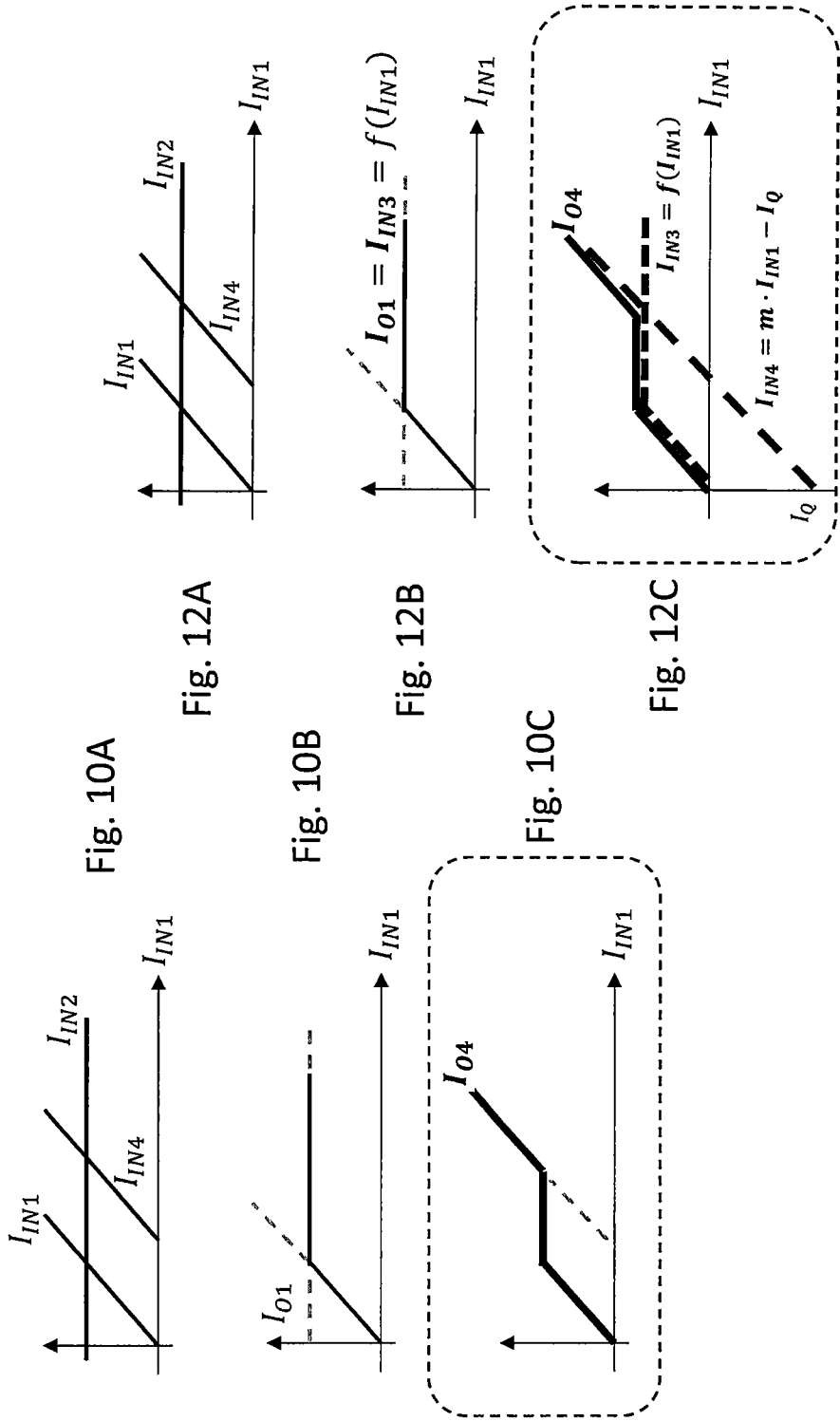
FIGS. 10A-10C show characteristic diagrams of the currents of the circuit of FIG. 9A, 9B.
FIGS. 12A-12C show characteristic diagrams of the currents of the circuit of FIG. 11A, 11B.

The behavior of the corresponding currents is shown in FIGS. 10A-10C also showing the currents as functions of the first current $I_{IN1}$. In particular, FIG. 10A shows a behavior of input currents $I_{IN1}$ and $I_{IN2}$ corresponding to that of FIG. 5A, while also the output current $I_{IN4}$ is increasing with a ramp, similarly to $I_{IN1}$. The result, shown in FIG. 10C, is that current $I_{O4}$ follows current $I_{O1}$ till $I_{O4}$ exceeds the constant value of the reference input current $I_{IN2}$, then follows the value of $I_{IN4}$ as dictated by the equation above, resulting in the piecewise linear characteristic of FIG. 10C.

FIG. 11A shows an embodiment in which two swapped cells, i.e. a NMOS latch 31 and a PMOS latch 31p, are used. This limits the need of large rails ($V_{dd}-V_{ss}$), $V_{dd}$ and $V_{ss}$ indicating the positive and negative supply voltage.

The output current $I_{O1}$ of the PMOS latch 31p is coupled to the input $I_{IN3}$ of the NMOS latch 31, to which other input $I_{IN4}$ is fed a respective current.

The output 104 is:

$$I_{O4}=\max(I_{IN3},I_{IN4})=\max(\min(I_{IN1},I_{IN2}),I_{IN4})$$

which is the same of the circuit of FIG. 9A, shown in the diagrams of FIGS. 10A-10C.

The output current $I_{O4}$ may be the result of a comparison between a function $f(I_{IN1})$ and a Current Reference Ramp (CRR) $I_{IN4}=m \cdot I_{IN1}-I_Q$, where m is the slope and and $I_Q$ the value of the y axis intercept, i.e. for $I_{IN1}=0$. In this case $I_{O1}=I_{IN3}=f(I_{IN1})$.

These currents are shown in the diagrams of FIGS. 12A-12C. FIG. 12B shows function $f(I_{IN1})$ as being the current ramp ($I_{IN1}$) limited to the constant value of $I_{IN3}$.

To generate a Current Reference Ramp (CRR) with a negative offset, i.e., when $I_{IN}=0$ $I_O<0$, may represent a difficulty since the current flow in a latch is unidirectional.

Since this ramp must be used only for positive current comparisons, it can be generated as:

$$I_O=m \cdot I_{IN}-I_Q \text{ for } I_{IN}>I_q=I_Q/m$$

Figure 13B:
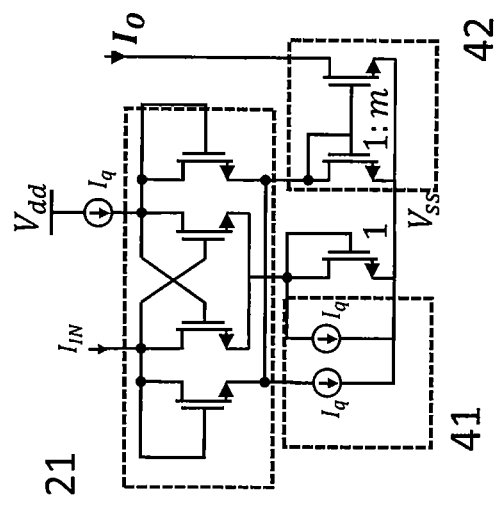
FIGS. 13A-13B show an embodiment of the circuit here described.
Figure 13A:
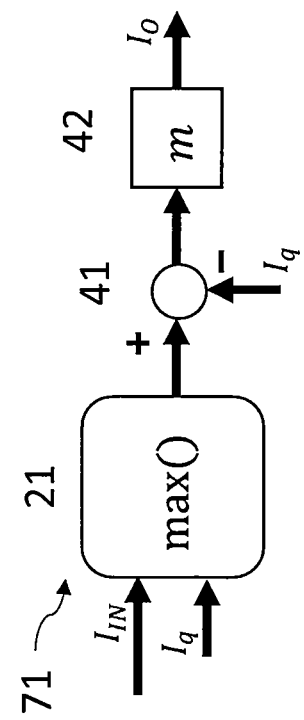

FIG. 13A shows schematically a circuit 71 to generate a ramp with negative offset, i.e., $I_Q>0$. Circuit 71 includes a latch cell 21 performing a max function, i.e., the output is collected on the maximizing node, to which are supplied as inputs $I_{i1}$, a ramp current like the one of FIG. 5A, and $I_{IN2}=I_Q$, constant value current corresponding to the negative offset value, then the maximizing output, e.g. 102, is taken. In a subtraction block 41 then the current constant value $I_Q$ is subtracted from the output of the latch 21. The result is fed to a multiply by integer m block 42 producing a final output current $I_O=m \cdot I_{IN}-mI_q=m \cdot I_{IN}-I_Q$, i.e. a ramp with negative offset.

FIG. 13B shows the corresponding circuital implementation, where the latch 31 is coupled to the circuit 60. The subtraction block 41 is embodied through current generators generating a constant current $I_Q$ which are coupled between the outputs of the latch 31 and the ground, drawing current from the output nodes of latch 31. The current $I_{O2}$, i.e., the maximizing output of latch 31, is taken by the second mirror, which has a 1:m mirroring ratio, thus forming the multiplier 42.

FIG. 14A shows the diagram of the input currents $I_{I1}$, $I_{I2}$, the ramp $I_{IN}$ and the constant value $I_Q$, and of max ($I_{IN}$, $I_0$) performed by block 21. FIG. 14B shows the diagram of the currents in input, max ($I_{IN}$, $I_Q$) and $I_Q$, and output, max ($I_{IN}$, $I_Q$)–$I_Q$, of the subtraction block 41, in FIG. 14C such current, max ($I_{IN}$, $I_Q$)–$I_Q$ as input of the multiplier 42 and the final output $I_O$=m·$I_{IN}$–$I_Q$, after the multiplication by m in the multiplier 42.

Figure 15B:
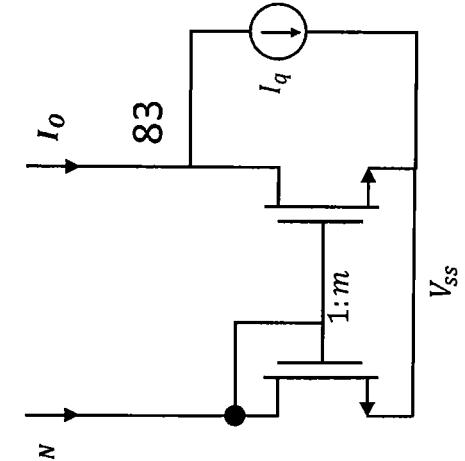
FIGS. 15A-15B show an embodiment of the circuit here described.
Figure 15A:
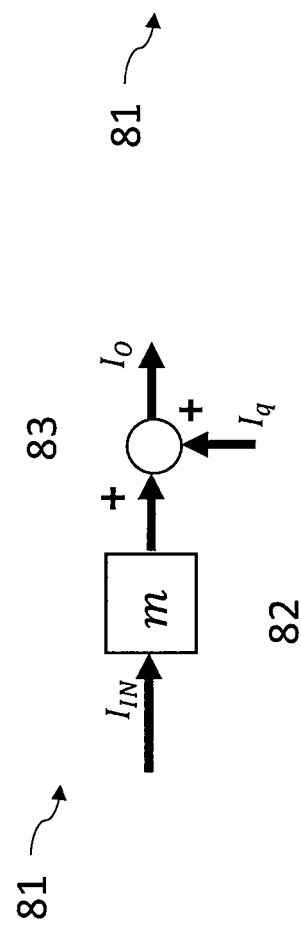

If it is needed to generate a Current Reference Ramp with a positive offset $I_O$=m·$I_{IN}$+$I_Q$, then it could be obtained as a circuit 81 comprising a chain of a multiplier by m 82 which output is summed in a summation block 83 to the constant offset current $I_Q$, as shown schematically in FIG. 15A. FIG. 15B shows the circuital implementation, where the multiplier 82 is obtained by a 1:m ratio mirror circuit to which output is summed the constant offset current $I_Q$ by a current generator 83.

Figure 16A:
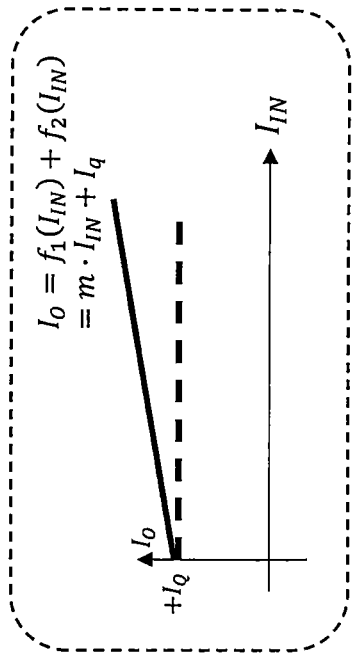
FIGS. 16A-16B show characteristic diagrams of the currents of the circuit of FIG. 15A, 15B.
Figure 16B:
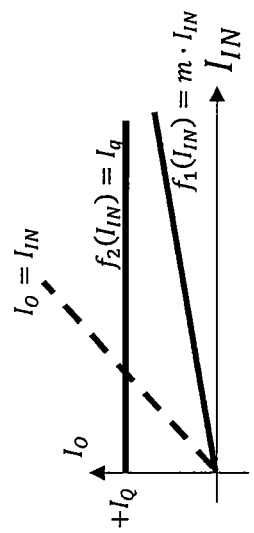

FIGS. 16A-16B show characteristic diagrams of the currents of the circuit of FIG. 15A, 15B, i.e., FIG. 16A shows the diagram of the input currents, the ramp $I_{IN}$ and the constant value $I_Q$, while FIG. 14B shows the diagram of the final output $I_O$=m·$I_{IN}$+$I_Q$.

Thus, as shown above, the solution is in the first place directed to an electronic circuit for generating a piecewise linear current transfer function, comprising at least a circuit module, such as latch cell 21 (or 31, 21P, 31P) comprising a first pair of MOS transistor $M_1$, $M_2$, e.g. NMOS or PMOS, and a second pair of MOS transistor $M_3$, $M_4$, each of the first pair of MOS transistors $M_1$, $M_2$ and second pair of MOS transistor $M_3$, $M_4$ having their drain electrodes coupled to a respective common input node, e.g. $V_1$, $V_2$, each of the first pair of MOS transistors $M_1$, $M_2$ and second pair of MOS transistor $M_3$, $M_4$ comprising a diode-connected MOS transistor, e.g., $M_1$, $M_4$, and a latched MOS transistor $M_2$, $M_3$, the latched MOS transistors $M_2$ and $M_3$ of the two pairs having their respective gate electrodes coupled to the drain of the other latched MOS transistor, $M_3$ and $M_2$ respectively, the source electrodes of the diode connected MOS transistors $M_1$, $M_4$ of the first pair and second pair being coupled to a respective current first output common node $I_{O2}$ and the source electrodes of the latched MOS transistors $M_2$, $M_3$ of the first pair and second pair being coupled to a respective second output common node $I_{O1}$.

The electronic circuit may be coupled to or comprise a first collecting circuit, such as transistor $M_6$, coupled to collect a current, e.g. $I_6$, at the first output common node, e.g. $V_4$, in particular to implement an input current maximizing function between currents applied at the input nodes, and/or a second collecting circuit, such as transistor $M_6$, coupled to collect a current, e.g. $I_6$, at the second output node, e.g. $V_3$, in particular to implement a current minimizing function between currents applied at the input nodes.

The electronic circuit may be coupled to or comprise one or more current supplying circuits, e.g., generators 22, configured to supply a first current, e.g. $I_{IN1}$, to the common input node of one between the first pair of transistors $M_1$, $M_2$ and the second pair of transistors, $M_3$, $M_4$, and/or a second current $I_{IN2}$ to the common input node of the other pair.

In general, two input currents are supplied, but as shown above, also only one input current can be supplied. Then, the electronic circuit 20 may have that the first input current $I_{IN1}$ is a variable current, in particular a ramp, and the second current $I_{IN2}$ is a constant reference current $I_{IN1}$.

Also, by combining two or more of such cells having as output max($I_{IN1}$, $I_{IN2}$) and/or min($I_{IN1}$, $I_{IN2}$), with the possibility of not using some inputs or some outputs (which is in this case preferably coupled to ground), it is possible to combine the output of each piecewise linear generating circuit or cell to obtain other PWL functions, as shown for instance with reference to FIGS. 9A, 9B, 11A, 11B.

To this regard, by way of example, a "triangle to quadratic" PWL generator may be obtained by using the latch blocks 21, 31, 21p, 31p described, nesting the previously discussed functions (max ( ) and min ( )) in which the arguments are a set of current reference ramps coded as two vectors containing the angular coefficient "m" and the offset coefficients "$I_q$", by cascading the corresponding latch cells.

Figures 19A, 19B:
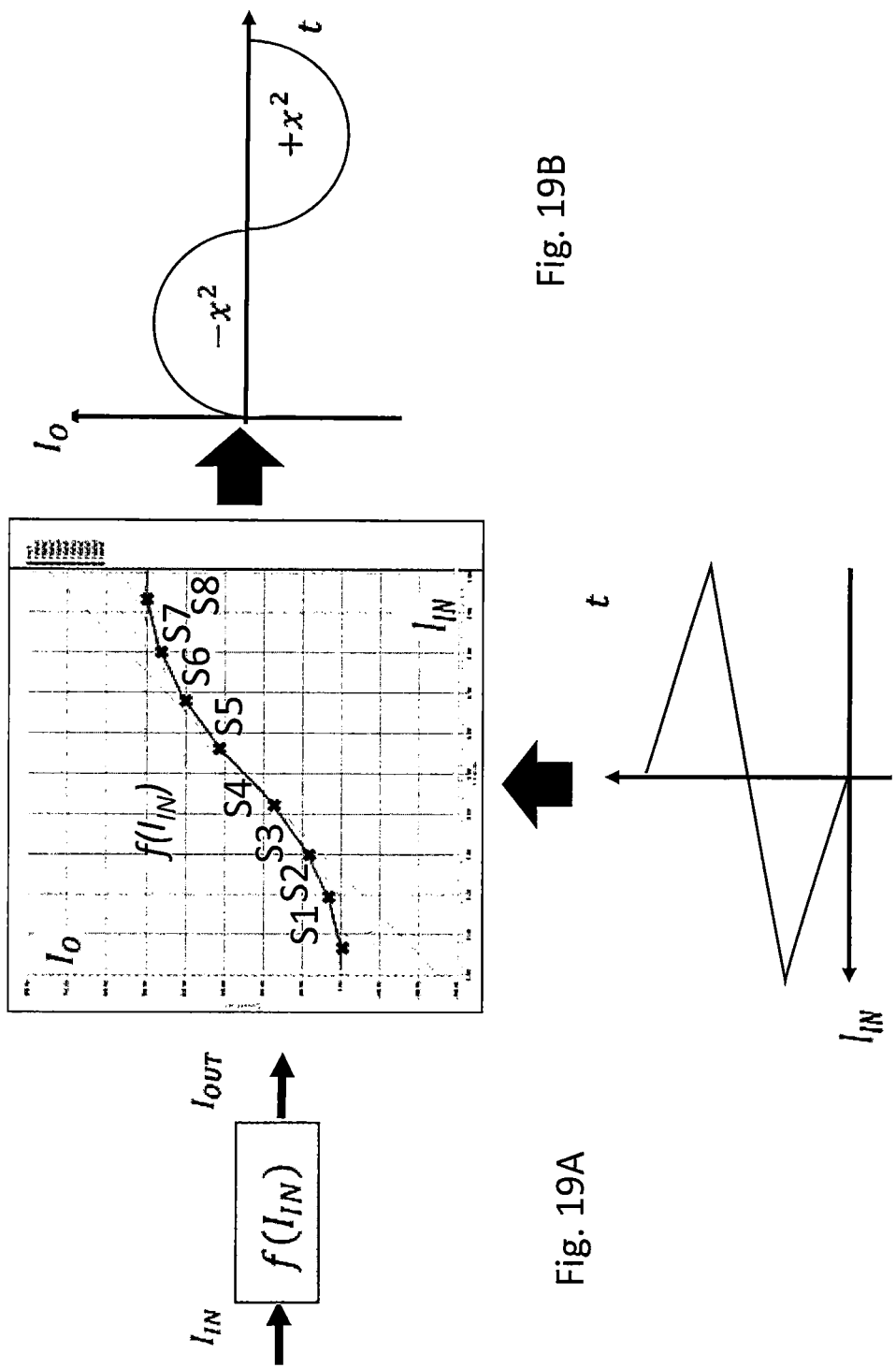
FIGS. 19A-19B show a schematic diagram of a piecewise linear function implemented by the circuits here described.

As shown in FIGS. 19A-19B, a piecewise linear transfer function f($I_{IN}$) between an input current $I_{IN}$ and an output current $I_O$ which determines a quadratic output may be implemented. A triangular waveform current $I_{IN}$ is applied as input to a circuit, obtained by cascading latch cells selected among latch cells 21, 31, 21p, 31p, and selecting the required maximizing or minimizing output to couple with the next cascaded cell, implementing a symmetric transfer function f($I_{IN}$) comprising a $-x^2$ and a $+x^2$ parabolic branches.

Figures 20A, 20B:
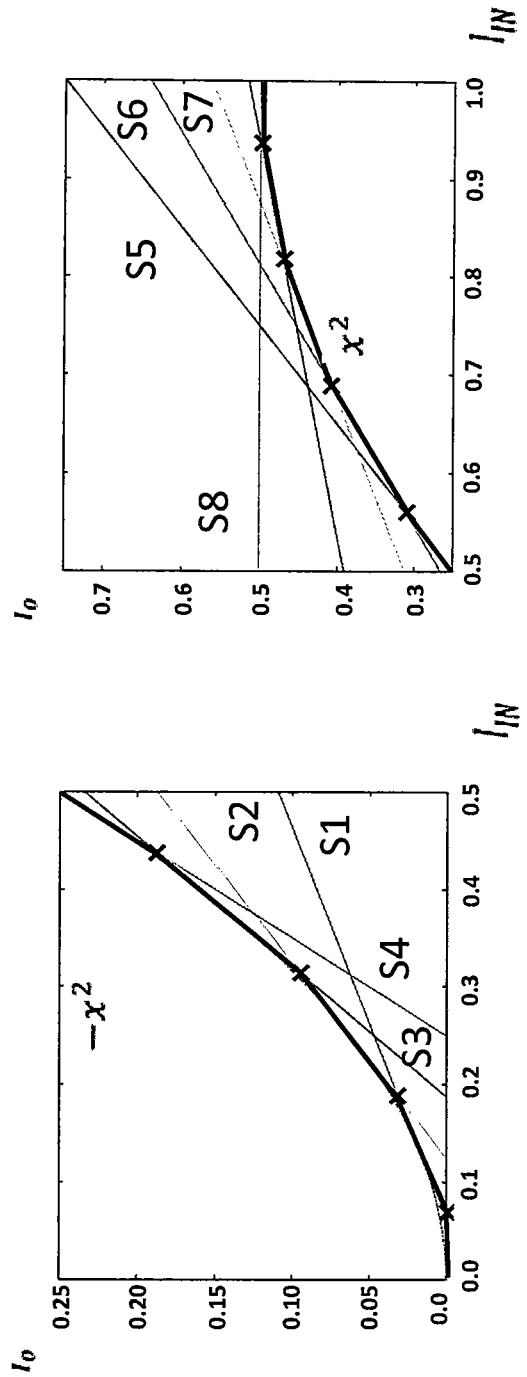
FIGS. 20A and 20B show a diagram representing details of the piecewise linear function of FIGS. 19A-19B.

As shown in FIGS. 20A and 20B due to the different concavities of the two branches of the transfer function f($I_{IN}$) the implementation of the PWL generator is divided in input in two sections $I_{IN}$=[0-0.5] and $I_{IN}$=[0.5-1.0] being [0-1] the amplitude of the triangular input current $I_I$. In FIG. 20A are indicated the values of the angular coefficients m and offset coefficient $I_{IQ}$ of the eight ramps, four for section, forming the piecewise linear transfer function f($I_{IN}$).

As shown, a sequence of four linear segment S1, S2, S3, S4 are used, defined by pairs of coefficient m and offset current $I_q$, which are respectively in the example shown (0.25, −0.01562), (0.5, −0.06250), (0.75, −0.14062), (1, −0.25). The value of coefficients m and offset current $I_q$ can be easily calculated with an approximation of the curve to generate in a given number of linear segments, for instance using programs like Matlab or Octave.

Then, each segment S1 . . . S4 can be generated with a respective circuit like the one in FIG. 13A (since offset currents are all negative) setting the required values of offset current $I_q$ and angular coefficient m. Then the first two segments S1 and S2 can be brought as input to a first maximizing block, obtaining max (S1,S2) which is then brought as input together with segment S3 to a second maximizing block, obtaining max (max (S1, S2), S3), which is then brought to a third maximizing block together with segment S4, obtaining max (max (max (S1, S2), S3), S4).

For the portion of curve of FIG. 20B, four linear segment S5, S6, S7, S8 are used, with pairs of coefficient m and offset current $I_q$, which are respectively (1, −0.252), (0.75, −0.109375), (0.5, −0.00625), (0.25, −0.2625).

The current ramps corresponding to segments S5, S6, S7, S8 can be obtained on the basis of their respective m,$I_q$ coefficients by the circuit of FIG. 13A (when the offset $I_q$ is positive) or FIG. 15A (when the offset $I_q$ is negative, like for S7, S8). Then segments S5, S6, S7, S8 are brought as input to a cascade of three maximizing block, in the same way as described for segments S1, S2, S3, S4, starting with the first two segments in the sequence.

Thus, in general the method for generating a piecewise linear characteristic may include performing cascading, i.e., coupling at least an output of a latch cell to the input of a cascaded latch cell, latch cells selected between cells 21, 31, 21P, 31P configured in a configuration selected between at least current maximizer configuration, i.e. the output of the latch cell is taken on the current maximizing node, current minimizer configuration, i.e. the output of the latch cell is taken on the current minimizing node, and current reference ramp generator configuration with negative offset 71 or positive offset 81, to obtain a given a determined linear piecewise characteristic. Of course, other type of circuits different from latch cells may be inserted in the cascade.

The method of generating a linear piecewise characteristic may include therefore defining a linear piecewise current characteristic to be obtained as a sequence of functions nested one into the other. For instance, with reference to FIG. 20, the sequence of segments S1, S2, S3, S4 which reproduces the quadratic function is defined as a sequence of nested max functions where the innermost is between the first two adjacent segments, S1, S2, and the subsequent have as arguments the result of the nested function and the next segment, i.e. max (max (max (S1, S2), S3), S4).

The method includes then to configure a first circuit for generating a piecewise linear current transfer function implementing the innermost nested function, in the example a cell 21, having as inputs segments S1, S2 for instance, which maximizing output is taken. Of course, segments S1 and S2 may be current ramps generated by circuits 71 or 81.

Then, the method includes configure and cascade subsequent circuits for generating a piecewise linear current transfer function to perform the subsequent nested functions, i.e., couple at each maximizing output of a cell 21 a further cell 21 having as other input the next segment in the sequence, and taking the maximizing output of such further cell 21.

For nested function is here intended a function which is enclosed in another, called the enclosing function. In a sequence of nested functions, only the innermost functions are nested functions, while the other are also enclosing function, and the outermost is only an enclosing function.

A further application of the circuit 20 and of the latched cell 21, 31 can be in the field of class AB amplifiers.

The amplifier represents the most important block in a multitude of electronic applications.

Under this view, the parameters correlated to the power consumption of the amplifier are very relevant.

Since nowadays battery powered devices are increasingly diffused, it is important that the power must be delivered to the load with negligible losses, i.e. efficiently.

So it is important to choose an amplifier stage capable to deliver large currents to the load with negligible DC bias power consumption. These are the most important characteristic of a Class-AB amplifier where the maximum deliverable current is much higher than the DC bias current.

On the other hand, even more applications need deliver large currents at high frequency to low resistance/high capacitance loads. One example, but not limited to, could be the TV/display driver stages. Large currents and high frequency operations may lead to electromagnetic disturbances of the neighboring environment.

Due to this reason, it is even important to design very efficient architectures capable to increase the lifetime of the battery powered devices without losing sight of the amplitude these current flows (i.e. current steps).

It is possible to highlight the most important key factors that a device should meet. A possible definition of the power efficiency is that it is directly proportional to the ratio of the current delivered to the load to the bias current consumption. On the other hand the noise, which is proportional to the high frequency current Ai should be minimized.

In a Class A stage, the efficiency is very low since the maximum delivered current is a portion of the biasing available current. This kind of amplifier stages are very common when the linearity is a priority.

The natural solution that maximize the power efficiency is the Class AB amplifier stage, which is capable of deliver to the load a current that is not-related-and-larger-than the biasing current.

The main drawback of the Class AB amplifier stage is that, despite it can deliver a current to the load that is uncorrelated with the DC biasing current, the maximum amplitude of this current is not well controlled when an input voltage step is applied.

A Class AB single stage operational transconductance amplifier is represented schematically to describe such drawback.

Figure 17:
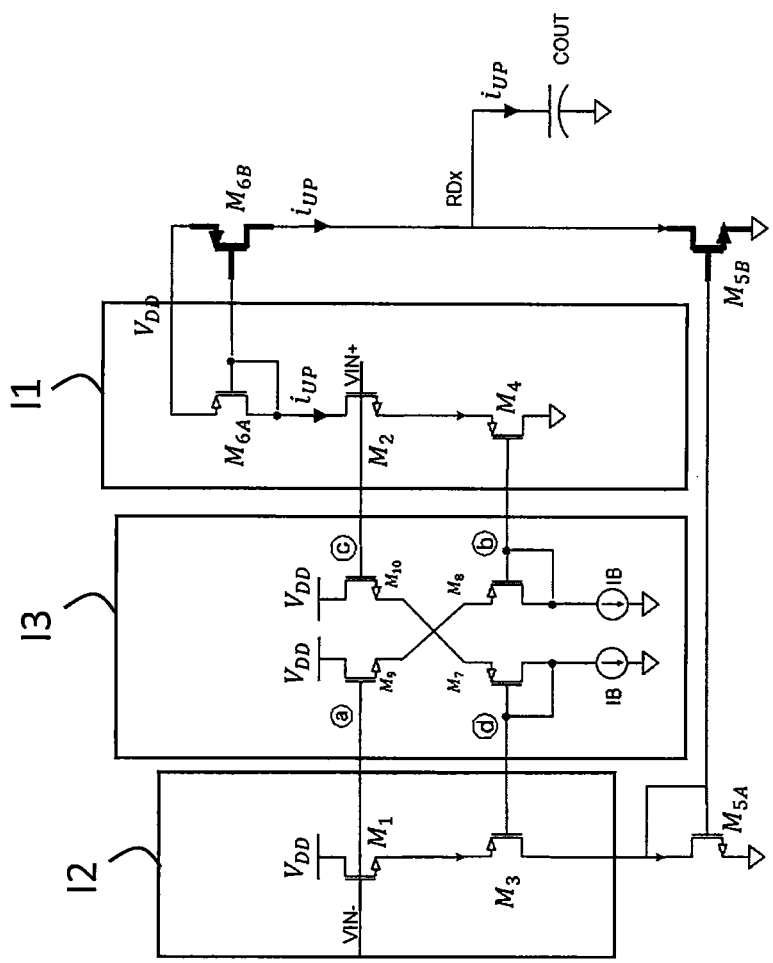
FIG. 17 shows a schematic circuit of a class AB amplifier.

The class AB amplifier circuit shown in FIG. 17 presents an input stage $I_1$, consisting of an NMOS transistor $M_2$ that acts as input terminal for a positive differential signal Vin(+) and as PMOS transdiode load $M_4$, of an input stage I2, consisting of an NMOS transistor $M_1$ that acts as input terminal for a negative differential signal Vin(−) and as PMOS transdiode load $M_4$, of an input stage with a shifted level, also called "level-shifted stage input", I3, consisting of NMOS transistors M9 and M10 and of PMOS transistors M7 and M8 in which M9 has the source electrode connected with the source electrode of M8, and M10 has the source electrode connected with the source electrode of M7. M7 and M8 have the gate connected to the drain which is coupled to ground through a respective bias current generator Ib. $M_1$ is coupled to VDD through its drain while $M_2$ is coupled to a first current mirror formed by PMOS M6A (diode connected, input of the mirror) and PMOS M6B, with their source coupled to VDD. The drains of $M_3$ and of M6B are coupled respectively to the drain of a NMOS $M_{5A}$ (diode connected) and of a NMOS M5B forming a second mirror coupled to the ground. The common node defined by the coupled drains of M6B, M5B defines an output node to which an output capacitance $C_{out}$ is coupled. A current IUP flowing in the first current mirror is injected both in the drain of $M_2$ and in the output node in condition of a large voltage step applied, as described in the following.

From FIG. 17, is possible to see that under biasing conditions, the MOS devices $M_{7,10}$ and $M_{8,9}$ forms a level shifter even for a small signal applied between $V_{IN+}$ and $V_{IN-}$. In fact, due to these MOS devices, if a small signal input $V_{IN-}$ is applied at the node a, it is directly seen on the node b. Since that the $V_{IN-}$ is applied on the gate of NMOS $M_4$ and $V_{IN+}$ is applied on the gate of $M_2$, then the couple $M_2$-$M_4$ forms an equivalent transconductance:

$$g_{m\_EQ} = g_{m2} // g_{m4}$$

where $g_{m2}$ and $g_{m4}$ are respectively, the transconductance of $M_2$ and $M_4$.

In DC biasing condition, if Vin_=Vin+ then the devices $M_7$-$M_3$ form a current mirror so the bias current $I_B$ appear on drain of $M_3$ and $M_1$.

Considering now a large voltage step applied between $V_{IN+}$ and $V_{IN-}$, under this condition, the MOS devices $M_1$ and $M_3$ are instantaneously off while the current $i_{UP}$ is generated from the previously discussed $g_{m\_EQ}$ of $M_2$-$M_4$.

Considering for simplicity that the dimensions of first mirror PMOS $M_{6A-6B}$ are the same, the current $i_{UP}$ is directly applied on the load $C_{OUT}$.

Under these assumptions, when a large voltage step is applied on the input of the amplifier 20, then a large current $i_{UP}$ is applied to the load and this current is uncorrelated from the biasing current $I_B$.

Thus, a Class AB amplifier it is used an efficient way to deliver a large current to the load $C_{OUT}$ but doing so it is lost the possibility to control and/or limit the maximum current to the load disregarding the amplitude of input, i.e. to control the input slew rate.

The solution here described is directed to a Class AB amplifier with a controlled output slew rate.

The output current $i_{OUT}$ is:

$$i_{OUT} = g_{m\_EQ} \cdot v_{IN} \quad (1)$$

From equation (1), is possible to see that the maximum deliverable current is proportional to the equivalent transconductance $g_{m\_EQ}$ and to the differential input voltage $v_{IN}$.

If the target is to limit the power line drops to limit the noise injected to the other devices, the current limitation must be independent from the input voltage like happen in Class A in slewing condition.

In addition, if the accuracy of the limiting current must be high, this architecture is not well suited since it depends on the absolute accuracy of the equivalent transconductance $g_{m\_EQ}$ and from the absolute of the maximum input voltage $v_{IN\_MAX}$. Either quantities are not well controlled since they depend on many factors (process, temperature, and voltages).

The solution here described introduces a slew rate limitation to an architecture where the deliverable current is intrinsically unlimited (Class AB).

Figure 18:
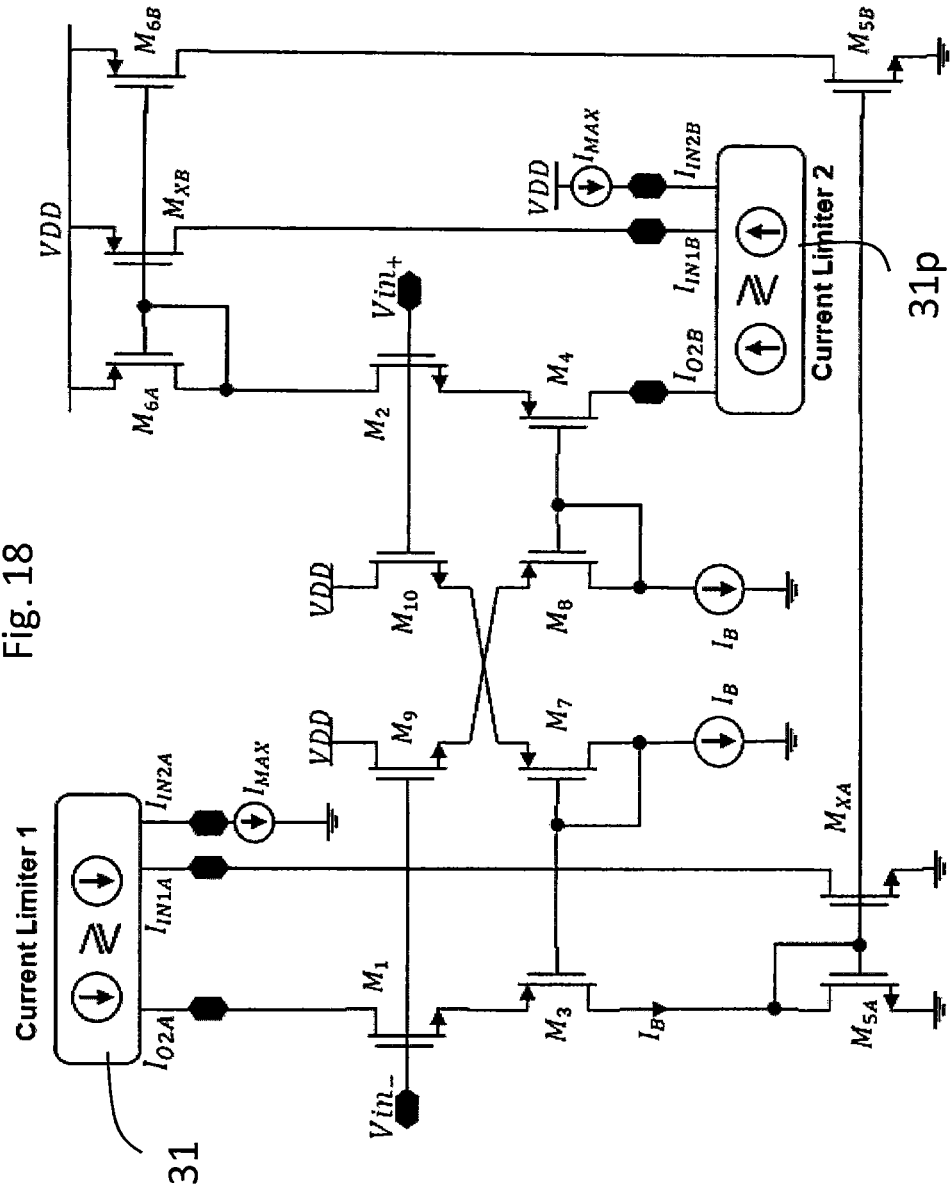
FIG. 18 shows a schematic circuit of a class AB amplifier implemented by the circuits here described.

FIG. 18 shows a schematic circuit of the proposed class AB amplifier, which includes inserting a current limiter on the current supplied to the load.

Such current limiter is for instance embodied by the latch 31. As shown in FIG. 18 a first latch cell 31p, of the PMOS type, has one of its current inputs $I_{IN1}$ receiving the current flowing in the second current mirror $M_{5A}$, $M_{5B}$, in particular by a NMOS $M_{XA}$ coupled in parallel with respect to the NMOS $M_{5B}$ on the second mirror, i.e. with its gate coupled to the gates of $M_{5A}$ and $M_{5B}$. The drain of the NMOS $M_{XA}$ is coupled to current inputs $I_{IN1}$. The second input current $I_{IN2}$ of the limiter 31 is coupled to a current generator drawing from it a maximum current $I_{MAX}$. The output of the latch 31p operating a limiter, indicated by 102, is coupled to the NMOS transistor $M_1$ that acts as input terminal for a negative differential signal Vin(−).

Symmetrically a second latch cell 31, of the NMOS type, has one of its current inputs $I_{IN1}$ receiving the current flowing in the first current mirror $M_{6A}$, $M_{6B}$, in particular by a PMOS $M_{XB}$ coupled in parallel with respect to the PMOS $M_{6B}$ on the second mirror, i.e. with its gate coupled to the gates of $M_{6A}$ and $M_{6B}$. The drain of the PMOS $M_{XB}$ is coupled to current input $I_{IN1}$. The second input current $I_{IN2}$ of the latch 31 is coupled to a current generator injecting in it a maximum current $I_{MAX}$.

With reference to the first latch 31p, supposing to have $I_B < I_{MAX}$, during the DC operation, since $I_{IN1} = I_B$ and $I_{IN2} = I_{MAX}$ then $I_{O2} = I_B$.

If a voltage drop $\Delta v$, e.g. a decrease of the voltage of a short time length is applied on the negative input Vin_ and the relative generated current on the drain of NMOS $M_3$ is less than the maximum current $I_{MAX}$, then, the current limiter, i.e. latch 31, is transparent and $I_{O2} = I_{IN1}$. While, if the voltage drop $\Delta v$ has an amplitude enough to generate a current at the drain of NMOS $M_3$ so that $I_{D3} > I_{MAX}$ (FIG. 4C) then, the current limiter will limit the current so that:

$$I_{O2} = I_{MAX} \quad (2)$$

There are two different current limiters since a symmetrical output current limitation is needed.

The solution just described regarding the class AB amplifier overcomes the problem discussed. In particular:

current levels delivered to the load are larger than the biasing currents;

current limiting (slew rate) is implemented in a Class AB architecture; and high accuracy of the limited/controlled maximum output current is obtained.

The claims are an integral part of the technical teaching of the disclosure provided herein.

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:

1. A circuit for generating a piecewise linear current transfer function, comprising:
   a latched circuit module cell comprising a first pair of transistors and a second pair of transistors, each of the first pair of transistors and the second pair of transistors having drain electrodes coupled to a respective common input node;
   a first current supplying circuit configured to supply a first current to the common input node of the first pair of transistors, wherein the first current is a variable current comprising a current ramp;
   a second current supplying circuit configured to supply a second current to the common input node of the second pair of transistors, wherein the second current is a constant reference current;
   wherein each of the first pair of transistors and the second pair of transistors comprises a diode-connected transistor and a latched transistor, wherein the latched transistors of the first pair of transistors and the second pair of transistors have gate and drain electrodes cross coupled; and
   wherein source electrodes of the diode-connected transistors are coupled to a first current output common node and wherein source electrodes of the latched transistors are coupled to a second current output common node.

2. The circuit according to claim 1, wherein the latched circuit module cell is coupled to a first current collecting circuit configured to collect a current at the first current output common node in order to implement an input current maximizing function between the first and second currents applied at the common input nodes of said latched circuit module cell.

3. The circuit according to claim 1, wherein the latched circuit module cell is coupled to a second collecting circuit configured to collect a current as the second current output node in order to implement a current minimizing function between the first and second currents applied at the common input nodes of said latched circuit module cell.

4. The circuit according to claim 1, wherein transistors of the first pair of transistors and the second pair of transistors are NMOS transistors.

5. The circuit according to claim 1, wherein transistors of the first pair of transistors and the second pair of transistors are PMOS transistors.

6. The circuit according to claim 1, wherein the latched circuit module cell is configured to have input currents and output currents flowing in opposite direction with respect to input and output nodes.

7. The circuit according to claim 1, wherein the latched circuit module cell is configured to have input currents and output currents both entering or exiting input and output nodes.

8. The circuit according to claim 1, wherein dimensions of transistors in the first pair of transistors and the second pair of transistors are the same.

9. A circuit for generating a piecewise linear current transfer function, comprising:
- a latched circuit module cell comprising a first pair of transistors and a second pair of transistors, each of the first pair of transistors and the second pair of transistors having drain electrodes coupled to a respective common input node;
- wherein each of the first pair of transistors and the second pair of transistors comprises a diode-connected transistor and a latched transistor, wherein the latched transistors of the first pair of transistors and the second pair of transistors have gate and drain electrodes cross coupled;
- wherein source electrodes of the diode-connected transistors are coupled to a first current output common node and wherein source electrodes of the latched transistors are coupled to a second current output common node; and
- wherein said latched circuit module cell receives an input current ramp and an input constant current corresponding to a negative offset and further comprising:
  - a first current collecting circuit coupled to collect a current at the first current output common node to implement an input current maximizing function between currents applied at the input nodes;
  - a subtraction circuit configured to subtract the input constant current from the first current output; and
  - a multiplier circuit configured to multiply by an integer in order to implement a current ramp with the negative offset.

10. The circuit according to claim 9, wherein transistors of the first pair of transistors and the second pair of transistors are NMOS transistors.

11. The circuit according to claim 9, wherein transistors of the first pair of transistors and the second pair of transistors are PMOS transistors.

12. The circuit according to claim 9, wherein the latched circuit module cell is configured to have input currents and output currents flowing in opposite direction with respect to input and output nodes.

13. The circuit according to claim 9, wherein the latched circuit module cell is configured to have input currents and output currents both entering or exiting input and output nodes.

14. The circuit according to claim 9, wherein dimensions of transistors in the first pair of transistors and the second pair of transistors are the same.

15. A piecewise linear generator comprising said circuit of claim 9.

16. A piecewise linear generator comprising said circuit of claim 1.

17. A class AB amplifier having a differential architecture, comprising:
- respective positive and negative input stages coupled to a level shifter;
- wherein said positive and negative input stages are coupled to a circuit for generating a piecewise linear current transfer function, comprising:
  - a latched circuit module cell comprising a first pair of transistors and a second pair of transistors, each of the first pair of transistors and the second pair of transistors having drain electrodes coupled to a respective common input node;
  - wherein each of the first pair of transistors and the second pair of transistors comprises a diode-connected transistor and a latched transistor, wherein the latched transistors of the first pair of transistors and the second pair of transistors have gate and drain electrodes cross coupled; and
  - wherein source electrodes of the diode-connected transistors are coupled to a first current output common node and wherein source electrodes of the latched transistors are coupled to a second current output common node.

18. A method for generating a piecewise linear transfer function, comprising:
- generating a piecewise linear current for transfer function using a plurality of circuits, wherein each circuit comprises:
  - a latched circuit module cell comprising a first pair of transistors and a second pair of transistors, each of the first pair of transistors and the second pair of transistors having drain electrodes coupled to a respective common input node;
  - wherein each of the first pair of transistors and the second pair of transistors comprises a diode-connected transistor and a latched transistor, wherein the latched transistors of the first pair of transistors and the second pair of transistors have gate and drain electrodes cross coupled; and
  - wherein source electrodes of the diode-connected transistors are coupled to a first current output common node and wherein source electrodes of the latched transistors are coupled to a second current output common node;
- defining a linear piecewise current characteristic as a sequence of functions nested one into another;
- configuring one of said circuits for generating the piecewise linear current transfer function implementing an innermost nested function of said sequence of functions; and
- configuring cascaded subsequent ones of said circuits for generating a piecewise linear current transfer function to perform subsequent nested functions of said sequence of functions.

19. A computer-program product that can be loaded into the memory of at least one processor and comprises portions of software code for implementing the method according to claim 18.

20. A circuit, comprising:
- a latched circuit module cell comprising a first pair of transistors and a second pair of transistors, the first pair of transistors having drain electrodes coupled to receive a first input current and the second pair of transistors having drain electrodes coupled to receive a second input current;
- wherein each of the first pair of transistors and the second pair of transistors comprises a diode-connected transistor and a latched transistor, wherein the latched transistors of the first pair of transistors and the second pair of transistors have gate and drain electrodes cross coupled;

wherein source electrodes of the diode-connected transistors are coupled to a first current output common node; and wherein source electrodes of the latched transistors are coupled to a second current output common node;

a first current collecting circuit comprising a first diode-connected transistor coupled to collect a first current at the first current output common node, said first current being a maximum current of the first and second input currents; and a second current collecting circuit comprising a second diode-connected transistor coupled to collect a second current at the second current output common node, said second current being a minimum current of the first and second input currents.

21. The circuit of claim 20:
wherein the first input current is a variable current comprising a current ramp; and
wherein the second input current is a constant reference current.

22. The circuit of claim 20:
wherein the first input current is a first variable current comprising a first current ramp; and
wherein the second input current is a second variable current comprising a second current ramp.

23. The circuit of claim 20, further comprising a current multiplier circuit configured to multiply one of the first and second currents by an integer value.

24. The circuit of claim 20, further comprising a current subtraction circuit configured to subtract a fixed current from one of the first and second currents.

25. A piecewise linear generator comprising said circuit of claim 20.

* * * * *